United States Patent [19]
Manning et al.

[11] Patent Number: 5,541,137
[45] Date of Patent: Jul. 30, 1996

[54] METHOD OF FORMING IMPROVED CONTACTS FROM POLYSILICON TO SILICON OR OTHER POLYSILICON LAYERS

[75] Inventors: Monte Manning, Kuna; Shubneesh Batra, Boise; Charles H. Dennison, Meridian, all of Id.

[73] Assignee: Micron Semiconductor Inc., Boise, Id.

[21] Appl. No.: 330,170

[22] Filed: Oct. 27, 1994

Related U.S. Application Data

[63] Continuation-in-part of Ser. No. 218,474, Mar. 24, 1994, abandoned.

[51] Int. Cl.[6] .......................... H01L 21/225; H01L 21/28
[52] U.S. Cl. .................. 437/162; 437/191; 148/DIG. 38; 148/DIG. 123
[58] Field of Search ...................... 437/191, 162, 437/233; 148/DIG. 30, DIG. 38, DIG. 123

[56] References Cited

U.S. PATENT DOCUMENTS

| | | | |
|---|---|---|---|
| 4,502,206 | 3/1985 | Schnable et al. | 437/24 |
| 4,800,176 | 1/1989 | Kakumu et al. | 437/192 |
| 4,978,629 | 12/1990 | Komori et al. | 437/162 |
| 5,047,357 | 9/1991 | Eklund | 437/162 |
| 5,272,099 | 12/1993 | Chou et al. | 437/162 |
| 5,315,150 | 5/1994 | Furuhata | 437/162 |
| 5,328,867 | 7/1994 | Chien et al. | 437/191 |
| 5,356,830 | 10/1994 | Yoshikawa et al. | 437/191 |
| 5,393,687 | 2/1995 | Liang | 437/162 |

FOREIGN PATENT DOCUMENTS

| | | | |
|---|---|---|---|
| 59-138332 | 8/1984 | Japan | 437/162 |

OTHER PUBLICATIONS

S. Wolf & R. N. Tauber "Silicon Processing for the VLSI Era" 1986 pp. 290–291, vol. 1.

*Primary Examiner*—Tom Thomas
*Assistant Examiner*—Leon Radomsky

[57] ABSTRACT

The method of the present invention introduces a method of forming conductively doped contacts on a supporting substrate in a semiconductor device that minimizes the lateral out-diffusion of the conductive dopants and also provides for a low resistive contact by the steps of: preparing a conductive area to accept contact formation; forming a phosphorus insitu doped polysilicon layer over the conductive area; forming an arsenic insitu doped polysilicon layer over the phosphorus insitu doped polysilicon layer, wherein the two insitu doped polysilicon layers are deposited one after another in separate deposition steps; and annealing the layers at a temperature range of approximately 900°–1100° C. thereby, resulting in sufficient thermal treatment to allow phosphorus atoms to break up a first interfacial silicon dioxide layer formed between the conductive area and the phosphorus insitu doped polysilicon layer.

23 Claims, 2 Drawing Sheets

METHOD OF FORMING IMPROVED CONTACTS FROM POLYSILICON TO SILICON OR OTHER POLYSILICON LAYERS

This invention was made with Government support under Contract No. MDA972-92-C-0054 awarded by Advanced Research Projects Agency (ARPA). The Government has certain rights in this invention.

This is a CIP of application(s) Ser. No. 08/218,474 filed on Mar. 24, 1994, abandoned.

FIELD OF THE INVENTION

This invention relates generally to semiconductor fabrication and in particular to a fabrication method for forming conductive contacts.

BACKGROUND OF THE INVENTION

In semiconductor fabrication the formation of contacts at a conductive silicon portion is an essential part of the process. For example, when an active device, such as a field effect transistor (FET) is formed by implanting dopants into a silicon substrate, the FET may need to have either its source or drain terminals (or both) make contact to subsequently formed conductively doped silicon layer. In some circuits, in order to reduce die size, layers of doped polysilicon are used to make contact to FET source and drains. One example is the use of poly as an interconnect level to decrease cell size SRAM circuits which is well known by those skilled in the art.

Since forming contacts are necessary, there are some main concerns that must be taken into account when forming polysilicon to silicon contacts or polysilicon to polysilicon contacts. One concern is the fact that the conductive dopants present in a heavily doped polysilicon will tend to diffuse out into the surrounding region (such as the bulk silicon of the semiconductor device). This out-diffusion of dopants can degrade adjacent FET devices by effectively shortening their channel length. For example, with contact regions that are self-aligned to a MOSFET gate edge (thereby minimizing the space between the contact region and the gate), if the polysilicon layer is insitu doped to a concentration of approximately $1E20$ $cm^{-3}$ with phosphorus then the lateral out-diffusion of the phosphorus dopants into the bulk silicon may be too great and diffuse under adjacent transistors thus causing short channel effects. On the other hand, simply reducing the phosphorus concentration to reduce the lateral out-diffusion will result in high sheet resistance of the polysilicon film itself.

Arsenic has a much lower diffusivity and hence can be substituted for phosphorus to reduce the lateral diffusion of dopants out of the contact region. However, the contact will become much more sensitive to the presence of a native oxide between the bulk silicon and the polysilicon. Hence, the contact resistance could possibly increase tenfold due to the fact that the arsenic dopants do not effectively break up the native oxide as well as phosphorus does.

What is needed is a method to form polysilicon to silicon contacts and polysilicon to polysilicon contacts that will minimize the lateral out-diffusion of conductive dopants and yet sufficiently break up any native oxide that is present between the two layers to thereby form a low resistive (ohmic) contact.

SUMMARY OF THE INVENTION

An embodiment of the present invention introduces a method of forming conductively doped contacts on a supporting substrate in a semiconductor device that minimizes the lateral out-diffusion of the conductive dopants and also provides for a low resistive contact by the steps of:

preparing a conductive area to accept contact formation;

forming a phosphorus doped polysilicon layer over said conductive area, said conductive area and said phosphorus layer having a first interfacial silicon dioxide layer therebetween;

forming an arsenic doped polysilicon layer over said phosphorus doped polysilicon layer, said arsenic doped polysilicon layer and said phosphorus doped polysilicon layer having a second interfacial silicon dioxide layer therebetween;

annealing said layers to provide a thermal treatment to allow phosphorus atoms to break up said first interfacial silicon dioxide layer while said second interfacial silicon dioxide layer deters the out-diffusion of phosphorus atoms into said arsenic doped polysilicon layer; and further annealing said layers so that said phosphorus atoms break up said second interfacial silicon dioxide layer.

DETAILED DESCRIPTION OF THE INVENTION

Figure 1:
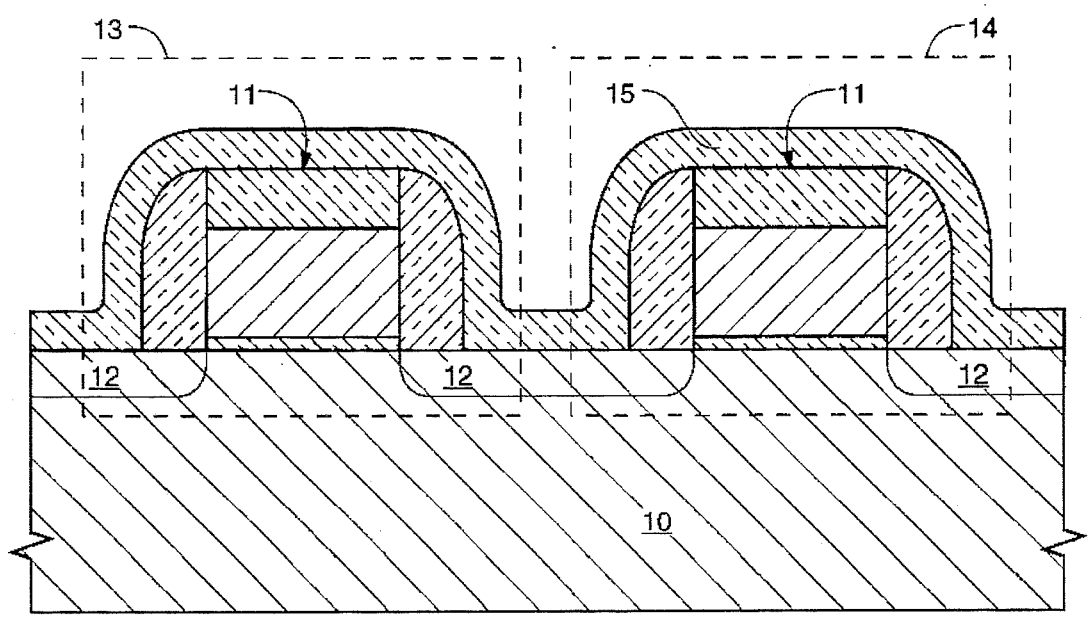
FIG. 1 is a composite cross-sectional view of a process wafer portion following the formation of active devices.
Figure 2:
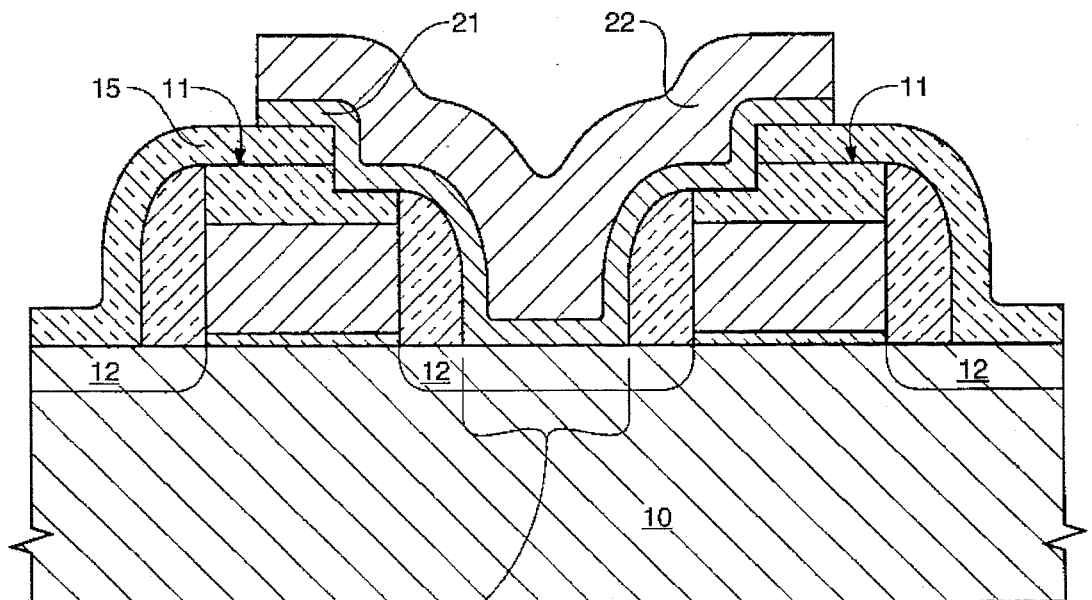
FIG. 2 is a composite cross-sectional view of the in process wafer portion of FIG. 1, depicting a first embodiment of the present invention where a polysilicon to silicon contact is formed.
Figure 3:
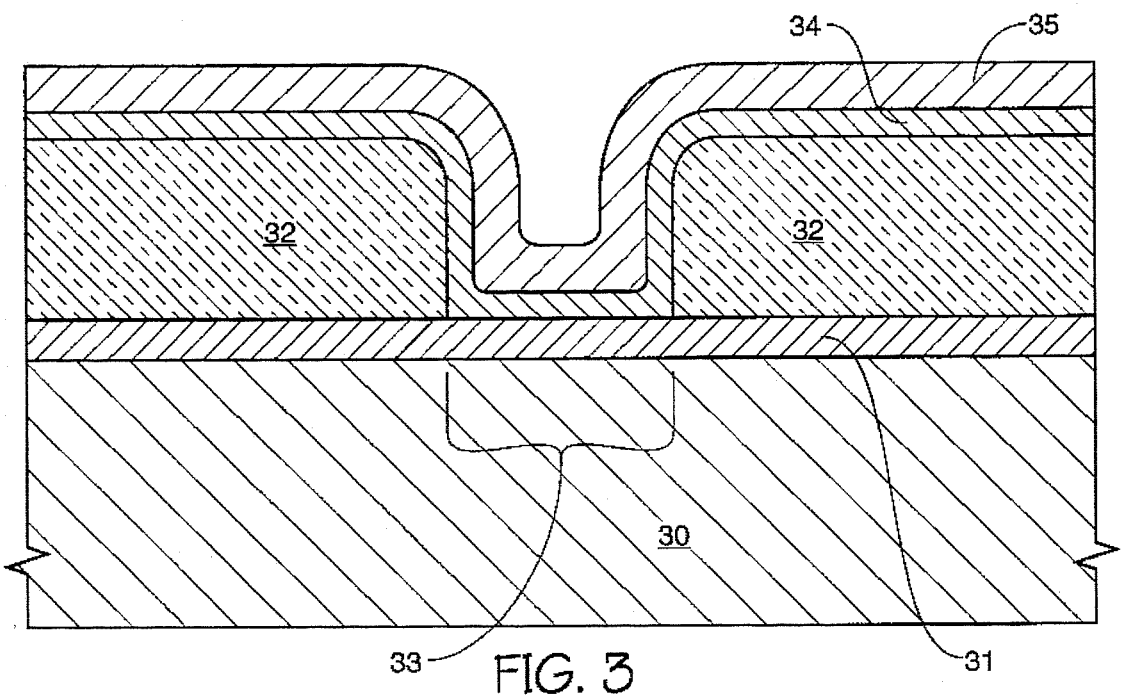
FIG. 3 is a composite cross-sectional view of the in process wafer portion depicting a second embodiment of the present invention where a polysilicon to polysilicon contact is formed.

The present invention, as depicted in FIGS. 1–3 demonstrates process steps integrated into a fabrication process of a semiconductor device, such as for a dynamic random access memory (DRAM) or a static random access memory (SRAM), that will provide contacts between two polysilicon or monocrystalline silicon layers. Though, the process described hereinafter, may be taken as reference to DRAM or SRAM fabrication, it is meant to serve as an example for practicing the present invention. As one skilled in the art will recognize from the detailed description that follows, the present invention may be integrated into any semiconductor fabrication process that requires the formation of polysilicon to silicon contacts or polysilicon to polysilicon contacts.

In a first embodiment and referring now to FIG. 1, a supporting substrate 10, such as silicon, is prepared to accept the formation of control gates 11 which bridge between dopant implanted diffusion regions 12 to form adjacent active devices 13 and 14. In this case, diffusion regions 12 have been implanted with phosphorus and/or arsenic. Following active device formation, a thin insulating layer 15 is formed to allow for the formation of a self-aligned contact region as depicted in FIG. 2.

Referring now to FIG. 2, the conductive area comprising diffusion region 12 is prepared to accept contact formation by performing a mask and etch step to expose a self-aligned contact region 20 at diffusion region 12 that resides between adjacent active devices 13 and 14. Next, a thin phosphorus insitu doped polysilicon layer 21 is formed over the diffusion region 12, thus making contact at location 20. Polysilicon layer 21 is highly doped to approximately a 1E20 cm$^{-3}$ concentration of phosphorus impurities. This is followed by the formation of a thick arsenic insitu doped polysilicon layer 22 over phosphorus layer 21.

The two insitu doped polysilicon layers 21 and 22 are formed by one of two methods. In the first method, the two layers are deposited one after another during the same deposition step, whereby phosphorus impurities are first introduced into a deposition chamber during a first deposition period of polysilicon material, which is followed by replacing the phosphorus impurities with arsenic impurities during a second deposition period of the polysilicon material. In the second method, the two insitu doped polysilicon layers are deposited one after another in separate deposition steps, thereby forming a second interfacial silicon dioxide layer therebetween. Though insitu doping of the polysilicon layers is preferred, both methods of the present invention would work by implanting dopants into each polysilicon layer after it was deposited.

Layers 21 and 22 are then subjected to an annealing step which is sufficient to break up any interfacial silicon dioxide layers (not shown) that are formed between diffusion region 12, layer 21 and layer 22. High phosphorus concentrations in polysilicon immediately adjacent to the first interfacial silicon dioxide (also referred to as native oxide) in conjunction with an anneal is effective in breaking up the native oxide to form ohmic contact between the two silicon layers. (Arsenic, regardless of doping concentration, has been shown to be ineffective at sufficiently breaking up native oxide.) It is preferred that the annealing step be performed at a temperature range such that the arsenic atoms and the phosphorus atoms diffuse into the conductive area no more than 500–1000 Å from the edge of the contact formation region. It is also preferred that the annealing temperature be in the range of approximately 900°–1100° C.

The second interfacial silicon dioxide layer formed between layers 21 and 22 enhances contact formation by initially hindering the out-diffusion of the phosphorus atoms into overlying arsenic insitu doped polysilicon layer 22. If out-diffusion of phosphorus were to occur, the concentration of phosphorus at the interface between layers 21 and 12 would be reduced which degrades the capability of the phosphorus in breaking up the first interfacial silicon dioxide. In order to prevent this out-diffusion of phosphorus, the intentionally formed second interfacial silicon dioxide layer between layers 21 and 22 initially deters the out-diffusion of phosphorus and allows sufficient time for the phosphorus atoms to break up the first interfacial silicon dioxide layer that exist between region 12 and layer 21. As the annealing step continues, the high concentration of phosphorus will then also break up the second interfacial silicon dioxide layer between layers 21 and 22 prior to out-diffusing into arsenic insitu doped polysilicon layer 22. It is preferred that arsenic insitu doped polysilicon layer 22 be at least five times greater in thickness than phosphorus insitu doped polysilicon layer 21. It is still further preferred that phosphorus insitu doped polysilicon layer 21 has a thickness in the range of 100–500 Å, is doped with a concentration of phosphorus greater than 5E19 cm$^{-3}$ and arsenic insitu doped polysilicon layer 22 has a thickness in the range of 500–5000 Å. Polysilicon layers 21 and 22 are then patterned appropriately and the semiconductor fabrication continues as necessary.

As the first interfacial and second interfacial silicon dioxide layers break up, phosphorus atoms begins to diffuse into the underlying and overlying silicon and polysilicon layers. Because phosphorus doped polysilicon layer 21 is thin, the doping concentration is quickly reduced as the phosphorus atoms diffuse away from layer 21. As this occurs, the concentration gradient of the phosphorus is quickly reduced which thereby reduces the lateral diffusion in the underlying silicon and thus minimizes the effect on adjacent devices. Since the arsenic dopants have a lower diffusivity than phosphorus, and since the arsenic is initially only present in layer 22 and is initially blocked from diffusing into layer 21 by the second interfacial layer therebetween, the lateral diffusion of arsenic from the contact is also minimized.

FIG. 3 depicts a second embodiment of the present invention where a polysilicon to polysilicon contact is formed. Supporting substrate 30 represents any material that may be formed prior to the formation of conductively doped polysilicon layer 31. Separation material 32 is formed over polysilicon 31 and then patterned to accept contact formation at location 33. The process steps are similar to those of the first embodiment wherein, a thin layer of highly insitu doped phosphorus polysilicon layer 34 is formed over polysilicon layer 31 and thus making contact at location 33. This is followed by the formation of a thick arsenic insitu doped polysilicon layer 35 over phosphorus layer 34. As before, the two insitu doped polysilicon layers are formed by one of two methods. In the first method, the two layers are deposited one after another during the same deposition step, whereby phosphorus impurities are first introduced into a deposition chamber during a first deposition period of polysilicon material, followed by replacing the phosphorus impurities with arsenic impurities during a second deposition period of the polysilicon material. In the second method, the two insitu doped polysilicon layers are deposited one after another in separate deposition steps, which forms a second interfacial silicon dioxide layer therebetween. As mentioned previously, though insitu doping of the polysilicon layers is preferred, both methods of the present invention would work by implanting dopants into each of the polysilicon layers after they are deposited.

Layers 34 and 35 are then subjected to an annealing step which is sufficient to break up any first interfacial and second interfacial silicon dioxide layers (not shown) that are formed between layers 31, 34 and 35. High phosphorus concentrations in polysilicon immediately adjacent to the first interfacial silicon dioxide (also referred to as native oxide) in conjunction with an anneal is effective in breaking up the native oxide to form ohmic contact between the two silicon layers. (Arsenic, regardless of doping concentration, has been shown to be ineffective at sufficiently breaking up native oxide.) It is preferred that the annealing step be performed at a temperature range such that the arsenic atoms and the phosphorus atoms diffuse into the conductive area no more than 500–1000 Å from the edge of the contact formation region. It is also preferred that the annealing temperature be in the range of approximately 900°–1100° C.

As the first interfacial and second interfacial silicon dioxide layers break up, phosphorus atoms begins to diffuse into the underlying and overlying polysilicon layers. Because phosphorus doped polysilicon layer 34 is thin, the doping concentration is quickly reduced as the phosphorus atoms diffuse away from layer 34. As this occurs, the concentration gradient of the phosphorus is quickly reduced which thereby reduces the lateral diffusion in the underlying polysilicon 31. Since the arsenic dopants have a lower diffusivity than phosphorus, and since the arsenic is initially only present in layer 35 and is initially blocked from diffusing into layer 34 by the second interfacial layer therebetween, the lateral diffusion of arsenic from the contact is also minimized.

The second interfacial silicon dioxide layer formed between layers 34 and 35 enhances contact formation by initially hindering the out-diffusion of the phosphorus atoms into overlying arsenic insitu doped polysilicon layer 35. If out-diffusion of phosphorus were to occur, the concentration of phosphorus at the interface between layers 34 and 31 would be reduced which degrades the capability of the phosphorus in breaking up the first interfacial silicon dioxide. In order to prevent this out-diffusion of phosphorus, the intentionally formed second interfacial silicon dioxide layer between layers 34 and 35 initially deters the out-diffusion of phosphorus and allows sufficient time for the phosphorus atoms to break up the first interfacial silicon dioxide layer that exist between layer 31 and layer 34. As the annealing step continues, the high concentration of phosphorus will then also break up the second interfacial silicon dioxide layer between layers 34 and 35 prior to out-diffusing into arsenic insitu doped polysilicon layer 35. It is preferred that arsenic insitu doped polysilicon layer 35 be at least five times greater in thickness than phosphorus insitu doped polysilicon layer 34. It is still further preferred that phosphorus insitu doped polysilicon layer 34 has a thickness in the range of 100–500 Å, is doped with a concentration of phosphorus greater than 5E19 cm$^{-3}$ and arsenic insitu doped polysilicon layer 35 has a thickness in the range of 500–5000 Å. Polysilicon layers 34 and 35 are then patterned appropriately and the semiconductor fabrication continues as necessary.

It is to be understood that although the present invention has been described in a preferred embodiment, various modifications known to those skilled in the art may be made without departing from the invention as recited in the several claims appended hereto.

What is claimed is:

1. A method of forming conductively doped contacts on a supporting substrate in a semiconductor device, said method comprising the steps of:

preparing a conductive area to accept contact formation;

forming a phosphorus doped polysilicon layer over said conductive area, said conductive area and said phosphorus layer having a first interfacial silicon dioxide layer therebetween;

forming an arsenic doped polysilicon layer over said phosphorus doped polysilicon layer that is at least five times greater in thickness than said phosphorus doped polysilicon layer, said arsenic doped polysilicon layer and said phosphorus doped polysilicon layer having a second interfacial silicon dioxide layer therebetween;

annealing said layers to provide sufficient thermal treatment to allow phosphorus atoms to break up said first interfacial silicon dioxide layer while said second interfacial silicon dioxide layer deters the out-diffusion of phosphorus atoms into said arsenic doped polysilicon layer; and further annealing said layers so that said phosphorus atoms break up said second interfacial silicon dioxide layer.

2. The method as recited in claim 1, wherein said supporting substrate comprises a silicon substrate.

3. The method as recited in claim 1, wherein said conductive area is a conductively doped portion of a silicon substrate.

4. The method as recited in claim 1, wherein said phosphorus doped polysilicon layer is doped with a concentration of phosphorus impurities greater than 5E19 cm$^{-3}$.

5. The method as recited in claim 1, wherein said conductive area is a conductively doped polysilicon material.

6. The method as recited in claim 1, wherein the two doped polysilicon layers are deposited one after another in separate deposition steps, thereby forming said second interfacial silicon dioxide layer therebetween.

7. The method as recited in claim 6, wherein the presence of said second interfacial silicon dioxide layer initially hinders the out-diffusion of said phosphorus atoms into said overlying arsenic doped polysilicon layer to thereby provide sufficient time for the phosphorus atoms to breakup said first interfacial silicon dioxide layer duringwhich the phosphorus atoms also break up said second interfacial silicon dioxide layer prior to out-diffusing into said arsenic doped polysilicon layer.

8. The method as recited in claim 1, wherein said phosphorus doped polysilicon layer has a thickness in the range of 100–500 Å and said arsenic doped polysilicon layer has a thickness in the range of 500–5000 Å.

9. The method as recited in claim 1, wherein said annealing step is performed at a temperature range of approximately 900°–1100° C.

10. The method as recited in claim 1, wherein said semiconductor device comprises memory devices.

11. The method as recited in claim 1, wherein said annealing step is performed such that the arsenic atoms and the phosphorus atoms diffuse into the conductive area no more than 500–1000 Å from the edge of said contact formation.

12. The method as recited in claim 1, wherein the two doped polysilicon layers are insitu doped.

13. The method as recited in claim 1, wherein the two doped polysilicon layers are doped by implantation.

14. A method of forming conductively doped contacts on a supporting substrate in a semiconductor device, said method comprising the steps of:

preparing a conductive area to accept contact formation;

forming a phosphorus insitu doped polysilicon layer over said conductive area, said conductive area and said phosphorus insitu doped polysilicon layer having a first interfacial silicon dioxide layer therebetween;

forming an arsenic insitu doped polysilicon layer over said phosphorus insitu doped polysilicon layer that is at least five times greater in thickness than said phosphorus doped polysilicon layer, said arsenic insitu doped polysilicon layer and said phosphorus insitu doped polysilicon layer having a second interfacial silicon dioxide layer therebetween and where the two insitu doped polysilicon layers are deposited one after another in separate deposition steps;

annealing said layers to provide sufficient thermal treatment to allow phosphorus atoms to break up said first interfacial silicon dioxide layer while said second interfacial silicon dioxide layer deters the out-diffusion of phosphorus atoms into said second polysilicon layer; and further annealing said layers so that said phosphorus atoms break up said second interfacial silicon dioxide layer.

15. The method as recited in claim 14, wherein said phosphorus doped polysilicon layer is doped with a concentration of phosphorus greater than 5E19 cm$^{-3}$.

16. The method as recited in claim 14, wherein said supporting substrate comprises a silicon substrate.

17. The method as recited in claim 14, wherein said conductive area is a conductively doped portion of a silicon substrate.

18. The method as recited in claim 14, wherein said conductive area is a conductively doped polysilicon material.

19. The method as recited in claim 14, wherein the presence of said second interfacial silicon dioxide layer initially hinders the out-diffusion of said phosphorus atoms into said overlying arsenic insitu doped polysilicon layer to provide sufficient time for the phosphorus atoms to breakup said first interfacial silicon dioxide layer during which the phosphorus atoms also break up said second interfacial silicon dioxide layer prior to out-diffusing into said arsenic insitu doped polysilicon layer.

20. The method as recited in claim 14, wherein said phosphorus insitu doped polysilicon layer has a thickness in the range of 100–500 Å and said arsenic insitu doped polysilicon layer has a thickness in the range of 500–5000 Å.

21. The method as recited in claim 14, wherein said annealing step is performed at a temperature range of approximately 900°–1100° C.

22. The method as recited in claim 14, wherein said semiconductor device comprises memory devices.

23. The method as recited in claim 14, wherein said annealing step is performed such that the arsenic atoms and the phosphorus atoms diffuse into the conductive area no more than 500–1000 Å from the edge of said contact formation.

\* \* \* \* \*